(12) United States Patent
Bucchignano et al.

(10) Patent No.: US 7,994,639 B2
(45) Date of Patent: Aug. 9, 2011

(54) MICROELECTRONIC STRUCTURE INCLUDING DUAL DAMASCENE STRUCTURE AND HIGH CONTRAST ALIGNMENT MARK

(75) Inventors: James J. Bucchignano, Yorktown Heights, NY (US); Gerald Warren Gibson, Jr., Danbury, CT (US); Mary Beth Rothwell, Ridgefield, CT (US); Roy Rongqing Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 828 days.

(21) Appl. No.: 11/831,138

(22) Filed: Jul. 31, 2007

(65) Prior Publication Data

US 2009/0032978 A1 Feb. 5, 2009

(51) Int. Cl.
*H01L 23/48* (2006.01)
*H01L 23/52* (2006.01)
*H01L 29/40* (2006.01)
*H01L 21/4763* (2006.01)

(52) U.S. Cl. ......... 257/758; 257/E21.495; 257/E23.179; 438/622

(58) Field of Classification Search .................. 257/758, 257/E23.179, E21.495; 438/622
See application file for complete search history.

(56) References Cited

U.S. PATENT DOCUMENTS

| | | | |
|---|---|---|---|
| 4,968,637 A * | 11/1990 | Mozzi et al. | 438/167 |
| 6,001,414 A | 12/1999 | Huang et al. | |
| 6,153,492 A * | 11/2000 | Wege et al. | 438/401 |
| 6,174,804 B1 | 1/2001 | Hsu | |
| 6,265,307 B1 | 7/2001 | Lou | |
| 6,372,647 B1 | 4/2002 | Lu et al. | |
| 6,420,791 B1 * | 7/2002 | Huang et al. | 257/797 |
| 6,642,138 B2 | 11/2003 | Pan et al. | |
| 6,661,106 B1 * | 12/2003 | Gilmour et al. | 257/797 |
| 6,780,761 B1 | 8/2004 | Wu et al. | |
| 7,037,841 B2 | 5/2006 | Wu et al. | |
| 7,056,821 B2 | 6/2006 | Yang et al. | |
| 7,060,605 B2 | 6/2006 | Uglow et al. | |
| 7,112,532 B2 | 9/2006 | Ali et al. | |
| 7,125,792 B2 | 10/2006 | Kumar et al. | |
| 7,129,159 B2 | 10/2006 | America et al. | |
| 7,129,162 B2 | 10/2006 | Hong et al. | |
| 7,160,799 B2 | 1/2007 | Lytle et al. | |
| 7,172,962 B2 | 2/2007 | Okayama et al. | |
| 7,176,126 B2 | 2/2007 | Oh et al. | |
| 2002/0142235 A1 * | 10/2002 | Hamanaka et al. | 430/5 |
| 2003/0015802 A1 * | 1/2003 | Watanabe | 257/774 |
| 2003/0052440 A1 * | 3/2003 | Tsuura | 267/100 |
| 2004/0013954 A1 * | 1/2004 | Gijsbertsen et al. | 430/22 |

(Continued)

*Primary Examiner* — Kiesha R Bryant
*Assistant Examiner* — Igwe U Anya
(74) *Attorney, Agent, or Firm* — Scully, Scott, Murphy & Presser, P.C.; Daniel P. Morris, Esq.

(57) ABSTRACT

A microelectronic structure, and in particular a semiconductor structure, includes a substrate and a dielectric layer located over the substrate. In addition at least one alignment mark is located interposed between the dielectric layer and the substrate. The at least one alignment mark comprises, or preferably consists essentially of, at least one substantially present element having an atomic number at least 5 greater than a highest atomic number substantially present element within materials surrounding the alignment mark Also included within the microelectronic structure is a dual damascene aperture located within the dielectric layer. The dual damascene aperture may be fabricated using, among other methods, a hybrid lithography method that uses direct write lithography and optical lithography, in conjunction with the at least one alignment mark and an electron beam as an alignment beam.

20 Claims, 7 Drawing Sheets

U.S. PATENT DOCUMENTS

| | | | |
|---|---|---|---|
| 2005/0064676 A1* | 3/2005 | Tobioka et al. | 438/401 |
| 2005/0156278 A1* | 7/2005 | Coolbaugh et al. | 257/532 |
| 2005/0196951 A1* | 9/2005 | Lin et al. | 438/622 |
| 2006/0017180 A1* | 1/2006 | Sarma | 257/797 |
| 2007/0105364 A1* | 5/2007 | Chia et al. | 438/618 |
| 2008/0020565 A1* | 1/2008 | Tseng et al. | 438/633 |

* cited by examiner

MICROELECTRONIC STRUCTURE INCLUDING DUAL DAMASCENE STRUCTURE AND HIGH CONTRAST ALIGNMENT MARK

BACKGROUND

1. Field of the Invention

The invention relates generally to lithography methods and lithography structures for fabricating dual damascene structures within microelectronic structures. More particularly, the invention relates to enhanced performance lithography methods and lithography structures for fabricating dual damascene structures within microelectronic structures.

2. Description of the Related Art

Microelectronic structures, and in particular semiconductor structures, are fabricated using lithographic methods. Lithographic methods typically include the use of successive resist layers that are latently imaged and subsequently developed and patterned over a substrate, such as but not limited to a semiconductor substrate, for purposes of fabricating any of several structures within the substrate. Particular structures that may be fabricated within or over a semiconductor substrate while using a patterned resist layer include selectively deposited structures and selectively etched structures, as well as selectively ion implanted structures.

A particularly desirable microelectronic structure that is commonly lithographically fabricated within the context of semiconductor structures is a dual damascene structure. Dual damascene structures are metallization structures that include, within a dielectric layer: (1) a lower lying via aperture; that is contiguous with and overlapped by (2) an upper lying trench aperture. At least a portion of an underlying conductor layer is typically exposed at the bottom of the lower lying via aperture. Typically formed within a dual damascene aperture is: (1) a via within the via aperture (i.e., where the via contacts the underlying conductor layer); that is contiguous with (2) an interconnect within the trench aperture. When forming the dual damascene aperture in general, various methods are known where either a via aperture may be formed first, or alternatively a trench aperture may be formed first.

While dual damascene apertures and the corresponding vias and contiguous interconnects which are located and formed therein certainly provide process efficiency when fabricating microelectronic structures, dual damascene structures are in general not entirely without problems. In particular as microelectronic technology advances, and microelectronic structure and device dimensions decrease, dual damascene apertures also often become more difficult to efficiently fabricate with decreasingly scaled dimensions. In particular, it is increasingly difficult to assure level to level overlay that provides proper connection to dual damascene structures within microelectronic structures. In addition, it is also becoming more difficult to assure proper via aperture and trench aperture alignment within a given particular dual damascene aperture which comprises a dual damascene structure.

Various methods for fabricating dual damascene structures within microelectronic structures are known in the microelectronic fabrication art.

For example, Yang et al., in U.S. Pat. No. 7,056,821, teaches a particular method for fabricating a dual damascene structure within a dielectric layer to provide for inhibited atmospheric exposure of an underlying conductor layer to which a via connection is made within the dual damascene structure. The particular method is a trench first method that uses an etch stop layer located upon the underlying conductor layer, where the etch stop layer is not etched to expose the underlying conductor layer until after forming the trench and the via within the dielectric layer.

In addition, Uglow et al., in U.S. Pat. No. 7,060,605, teaches another particular method for fabricating a dual damascene structure within a dielectric layer with enhanced process efficiency and performance. The particular method uses in-part a low dielectric constant dielectric material within a portion of the dielectric layer within which is formed the dual damascene aperture.

Dual damascene apertures and dual damascene structures are likely to continue to be prevalent as microelectronic technology, and in particular semiconductor technology, advances. Thus, desirable are dual damascene apertures and dual damascene structures with continuing scaled dimensions, as well as methods for fabricating those dual damascene apertures and dual damascene structures with continuing scaled dimensions.

SUMMARY OF THE INVENTION

The invention provides a microelectronic structure and a method for fabricating the microelectronic structure. The microelectronic structure in accordance with the invention includes a dielectric layer located over a substrate. The dielectric layer has a dual damascene aperture located within the dielectric layer. The microelectronic structure also includes an alignment mark located at least in-part over the substrate. Within the microelectronic structure, the alignment mark comprises, and preferably consists essentially of at least one substantially present element having an atomic number at least 5 greater than a highest atomic number substantially present element within materials that surround the alignment mark (i.e., including the substrate), and preferably at least 10 greater, and more preferably at least 20 greater than the highest atomic number substantially present element within materials that surround the alignment mark. Typically, within the context of a silicon containing semiconductor and/or dielectric substrate, the alignment mark will comprise a substantially present element having an atomic number greater than about 19, more preferably from about 19 to about 109 and still more preferably from about 55 to about 86. Although by no means limiting the invention, a particular candidate material for the alignment mark includes a tungsten material.

The term "substantially present element" is intended to represent an element present in greater than about 25 atomic percent, more preferably greater than about 50 atomic percent and still more preferably greater than about 75 atomic percent. Intended to be excluded are "insubstantially present elements" such as dopant elements within semiconductor substrates, that are present in amounts generally much less than 1 atomic percent.

The invention provides a microelectronic structure, typically a semiconductor structure, that includes: (1) a dual damascene aperture; as well as (2) at least one alignment mark that may comprise, and preferably may consist essentially of, at least one material that has an atomic number of greater than about 19 amu, and more preferably from about 55 to about 86. Within a particular method further in accordance with the invention, the at least one alignment mark is used for fabricating the dual damascene aperture within the microelectronic structure.

The alignment mark in accordance with the foregoing generally higher atomic number material composition is desirable insofar as such an alignment mark provides a high contrast with surrounding materials. Such surrounding materials may comprise in particular an overlying conductor layer that comprises, or preferably consists essentially of, at least one material that has an atomic number less than about 35, and preferably from about 19 to about 35.

A microelectronic structure in accordance with the invention includes a dielectric layer located over a substrate and including a dual damascene aperture within the dielectric layer. The microelectronic structure also includes an alignment mark located over the substrate. The alignment mark includes at least one substantially present element having an atomic number at least 5 greater than a highest atomic number substantially present element within materials surrounding the alignment mark over the substrate.

A method for fabricating a microelectronic structure in accordance with the invention includes providing a structure that includes a dielectric layer located over a substrate, and at least one alignment mark located interposed between the dielectric layer and the substrate. The at least one alignment mark includes at least one substantially present element having an atomic number at least 5 greater than a highest atomic number substantially present element within materials surrounding the alignment mark. This particular method also includes forming one of a trench aperture and a via aperture within the dielectric layer while using the at least one alignment mark for lithographically aligning the substrate. This particular method also includes forming the other one of the trench aperture and the via aperture within the dielectric layer while using the at least one alignment mark for lithographically aligning the substrate, to form a dual damascene aperture within the dielectric layer.

Another method for fabricating a microelectronic structure in accordance with the invention includes providing a structure that includes a dielectric layer located over a substrate, and at least one alignment mark located interposed between the dielectric layer and the substrate. The at least one alignment mark includes at least one substantially present element having an atomic number at least 5 greater than a highest atomic number substantially present element within materials surrounding the alignment mark. The method also includes forming a trench aperture within the dielectric layer while using an optical lithographic method that uses the at least one alignment mark for lithographically aligning the substrate. The method also includes forming a via aperture within the dielectric layer and contiguous with the trench aperture while using a direct write lithography method that uses the at least one alignment mark for lithographically aligning the substrate, to thus form a dual damascene aperture within the dielectric layer.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, that form a material part of this disclosure, wherein.

DESCRIPTION OF THE PREFERRED EMBODIMENT

The invention, which includes a microelectronic structure and a method for fabricating the microelectronic structure, is understood within the context of the description set forth below. The description set forth below is understood within the context of the drawings described above. Since the drawings are intended for illustrative purposes, the drawings are not necessarily drawn to scale.

Figure 1:
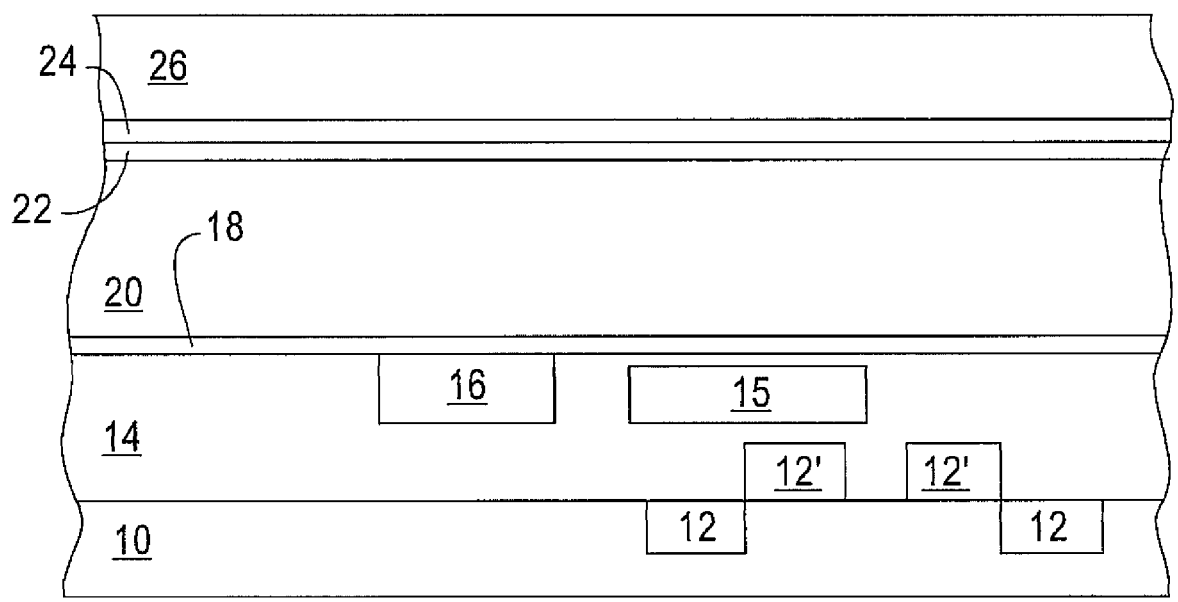
FIG. 1 to FIG. 11 show a series of schematic cross-sectional diagrams illustrating the results of progressive stages in fabricating a semiconductor structure in accordance with a particular embodiment of the invention.

FIG. 1 to FIG. 11 shows a series of schematic cross-sectional diagrams illustrating the results of progressive stages in fabricating a microelectronic structure, and in particular a semiconductor structure, in accordance with a particular embodiment of the invention. The particular embodiment of the invention comprises a preferred embodiment of the invention. While the preferred embodiment illustrates the invention within the context of a semiconductor structure, the invention is not intended to be so limited. Rather, the preferred embodiment and the invention may also be practiced within the context of alternative microelectronic structures which need not necessarily be semiconductor structures. Such alternative microelectronic structures will typically use microelectronic substrates other than semiconductor substrates. Such other microelectronic substrates may include, but are not necessarily limited to ceramic substrates, glass substrates and glass-ceramic substrates. FIG. 1 shows a schematic cross-sectional diagram of the semiconductor structure at an early stage in the fabrication thereof in accordance with the preferred embodiment.

FIG. 1 shows a semiconductor substrate 10 as a reference plane upon, over or above which other layers and structures are located and fabricated in accordance with the embodiment. In particular: (1) a first dielectric layer 14 is located and formed upon the semiconductor substrate 10; (2) a first capping layer 18 is located and formed upon the first dielectric layer 14; (3) a second dielectric layer 20 is located and formed upon the first capping layer 18; (4) a second capping layer 22 is located and formed upon the second dielectric layer 20; (5) a hard mask layer 24 is located and formed upon the second capping layer 22; and (6) a resist layer 26 is located and formed upon the hard mask layer 24. FIG. 1 also shows: (1) a plurality of alignment marks 12 embedded within the semiconductor substrate 10 at an interface with the first dielectric layer 14; as well as (2) a plurality of alignment marks 12' embedded within the first dielectric layer 14 at the interface with the semiconductor substrate 10. FIG. 1 finally shows: (1) a buried conductor layer 15 embedded within the first dielectric layer 14 and covering certain of the alignment marks 12 and 12'; as well as (2) a conductor contact layer 16 embedded within the first dielectric layer 14 at an interface with the first capping layer 18.

With the exception of the alignment marks 12 and 12' and the embedded conductor layer 15, each of the foregoing semiconductor substrate 10 and overlying layers may individually comprise materials, have dimensions and be formed using methods that are otherwise generally conventional in the semiconductor fabrication art.

The semiconductor substrate 10 comprises a semiconductor material. The semiconductor material may be selected from the group including but not limited to silicon, germanium, silicon-germanium alloy, silicon-carbon alloy, silicon-germanium-carbon alloy and compound (i.e., III-V and II-VI) semiconductor materials. Non-limiting examples of compound semiconductor materials further include gallium arsenide, indium arsenide and indium phosphide semiconductor materials.

While FIG. 1 illustrates the embodiment within the context of a semiconductor substrate 10 that comprises a bulk semiconductor substrate, neither the embodiment nor the invention is intended to be so limited. Rather, the embodiment and the invention alternatively contemplate the use of a semiconductor-on-insulator substrate or a hybrid orientation substrate for the semiconductor substrate 10.

A semiconductor-on-insulator substrate includes a buried dielectric layer interposed between a base semiconductor substrate portion of a semiconductor substrate and a surface semiconductor layer portion of the semiconductor substrate. The base semiconductor substrate and the surface semiconductor layer may be identical or different with respect to semiconductor material composition, crystallographic orientation, dopant polarity and dopant concentration. A hybrid orientation substrate includes multiple crystallographic orientation semiconductor regions supported upon a single semiconductor substrate. Semiconductor-on-insulator substrates and hybrid orientation substrates may be fabricated using methods that are conventional in the semiconductor fabrication art. Included in particular are ion implantation oxidation methods, layer transfer methods and layer lamination methods.

Although also not particularly illustrated within the schematic cross-sectional diagram of FIG. 1, the semiconductor substrate 10, regardless of whether the semiconductor substrate 10 comprises a bulk semiconductor substrate, a semiconductor-on-insulator substrate, a hybrid orientation substrate or an alternative semiconductor substrate, typically and preferable has microelectronic devices, such as semiconductor devices, located therein and/or thereupon. Such microelectronic devices may include, but are not necessarily limited to: (1) active semiconductor devices such as but not limited to diodes and transistors; as well as (2) passive devices which need not necessarily be semiconductor devices, such as resistors and capacitors.

The embodiment imposes particular constraints upon the plurality of alignment marks 12 and 12', within the context of materials from which may be comprised the plurality of alignment marks 12 and 12'. In particular, each of the alignment marks 12 and 12' comprises, and preferably consists essentially of, at least one substantially present element having an atomic number at least 5 greater than a highest atomic number substantially present element within materials that surround the alignment mark (i.e., including the substrate), and preferably at least 10 greater, and more preferably at least 20 greater than the highest atomic number substantially present element within the materials that surround the alignment mark. Typically, within the context of a silicon containing semiconductor and/or dielectric substrate, the alignment marks 12 and 12' will comprise a substantially present element having an atomic number greater than about 19, more preferably from about 19 to about 109 and still more preferably from about 55 to about 86. Although by no means limiting the invention, a particular candidate material for the alignment marks 12 and 12' includes a tungsten material.

The term "substantially present element" is intended to represent an element present in greater than about 25 atomic percent, more preferably greater than about 50 atomic percent and still more preferably greater than about 75 atomic percent. Intended to be excluded are "insubstantially present elements" such as dopant elements within semiconductor substrates 10, that are present in amounts generally much less than 1 atomic percent.

As will be discussed in further detail below, such a comparatively high atomic number for a material from which is comprised the alignment marks 12 and 12' is desirable to provide enhanced electron beam contrast when aligning a reticle or a direct write beam with respect to a resist layer (i.e., such as the resist layer 26) that is located and formed over the semiconductor substrate 10.

As noted above, while by no means limiting the embodiment or the invention, within the context of the above defined materials limitations for the alignment marks 12 and 12' tungsten is a particularly desirable candidate material for the alignment marks 12 and 12'. Tantalum is also a desirable and functional candidate material. Gold, while a candidate material within the context of having an appropriate atomic number, is nonetheless not necessarily desirable within the context of particular chemical or physical properties.

The particular locations of the alignment marks 12 and 12' provide generally differing advantages within the embodiment. In particular, the alignment mark 12 by virtue of the location thereof embedded within the semiconductor substrate 10 at the interface of the semiconductor substrate with the first dielectric layer 14, may desirable be used for aligning both front end of line (FEOL) structures (i.e., semiconductor device structures) and back end of line (BEOL) structures (i.e., dielectric and metallization structures) within the semiconductor structure of the instant embodiment. Alternatively, the location of the alignment mark 12' embedded within the first dielectric layer 14 at the interface of the first dielectric layer 14 with the semiconductor substrate 10 is desirable since that particular alignment mark 12' may be fabricated simultaneously with a contact via to a semiconductor device fabricated within the semiconductor substrate 10. Such a contact via often comprises tungsten as a contact material.

The first dielectric layer 14 and the second dielectric layer 20 may comprise any of several dielectric materials from which may, in general, be comprised pre-metal dielectric layers, inter-level dielectric layers and intra-level dielectric layers within semiconductor structures. Within the context of this particular passivating layer application illustrated in FIG. 1, the first dielectric layer 14 and the second dielectric layer 20 may comprise generally higher dielectric constant dielectric materials (i.e., having a dielectric constant from about 4 to about 20), such as but not limited to silicon oxide, silicon nitride and silicon oxynitride dielectric materials. Alternatively, and preferably, the first dielectric layer 14 and the second dielectric layer 20 may each individually also comprise a generally lower dielectric constant dielectric material (i.e., having a dielectric constant from about 2.5 to about 4) such as but not limited to a spin-on-glass dielectric material, a spin-on-polymer dielectric material, a micro-porous dielectric material, a nano-porous dielectric material, a carbon doped dielectric immaterial or a fluorine doped dielectric material. Also contemplated within the context of the instant embodiment are laminates and composites of any of the foregoing dielectric materials. Typically, each of the first dielectric layer 14 and the second dielectric layer 20 comprises at least in part a generally lower dielectric constant dielectric material as disclosed above. Typically, each of the first dielectric layer 14 and the second dielectric layer has a thickness from about 500 to about 2500 angstroms.

The embedded conductor layer 15 may comprise a generally conventional conductor material, provided that the generally conventional conductor material comprises, or preferable consists essentially of, a conductor material that has an atomic number within the context of the above described surrounding material limitations for the alignment marks 12 and 12'. Typically, such a conductor material will have an atomic number less than about 35, and preferably from about 19 to about 35. As will be discussed in further detail below, a conductor material having such a generally low atomic number less than about 35 is generally transparent to an electron beam alignment beam that may be used to align a direct write beam or a reticle with respect to the resist layer 26 and the semiconductor substrate 10. Candidate conductor materials for the buried conductor layer 15 may thus generally include certain metals, metal alloys, metal silicides and metal nitrides, as well as doped polysilicon materials (i.e., having a dopant concentration from about 1e18 to about 1e22 dopant atoms per cubic centimeter) and polycide (i.e., doped polysilicon/metal silicide stack) materials. More particularly, copper conductor materials, aluminum conductor materials and related alloys thereof may be used for forming the embedded conductor layer 15.

The conductor contact layer 16 may generally comprise a conductor material selected from the same group of conductor materials as the embedded conductor layer 15, but without any particular limitation upon an atomic number of the material from which is comprised the conductor contact layer 16, as long as the conductor contact layer 16 does not cover and obscure in plan-view the alignment marks 12 and 12'.

The individual particular conductor materials from which may be comprised the buried conductor layer 15 and the conductor contact layer 16 may be formed using methods that are appropriate to their individual materials of composition. Non-limiting examples include plating methods, chemical vapor deposition methods and physical vapor deposition methods. Generally, each of the embedded conductor layer 15 and the conductor contact layer 16 comprises a copper containing conductor material layer that has a generally conventional thickness. Also included for the embedded conductor layer 15 and the conductor contact layer 16 are barrier layers intended to inhibit interdiffusion of particular conductor materials with the dielectric materials from which may be comprised the first dielectric layer 14.

The first capping layer 18 and the second capping layer 22 may comprise the same or different capping materials. The first capping layer 18 in particular is intended to inhibit interdiffusion of a conductor material from which is comprised the conductor contact layer 16, with the second dielectric layer 20. Similarly the second capping layer 22 is also intended as a protective capping layer with respect to second dielectric layer 20. The first capping layer 18 and the second capping layer 22 may comprise a capping material, such as but not limited to a silicon oxide capping material, a silicon nitride capping material, a silicon oxynitride capping material and carbon doped analog of any of the foregoing capping materials. Preferably, each of the first capping layer IS and the second capping layer 22 comprises a carbon and nitrogen doped silicon oxide capping material that has a particular material composition optimized with respect to both barrier properties and dielectric constant properties. Each of the first capping layer 18 and the second capping layer 22 may be formed using methods that are generally conventional in the semiconductor fabrication art. Non-limiting examples include thermal or plasma oxidation or nitridation methods, chemical vapor deposition methods and physical vapor deposition methods. Typically, each of the first capping layer 18 and the second capping layer 22 has a thickness from about 100 to about 1000 angstroms.

The hard mask layer 24 comprises a hard mask material. Non-limiting examples of hard mask materials include silicon oxide hard mask materials, silicon nitride hard mask materials and silicon oxynitride hard mask materials. In general, the foregoing hard mask materials may be formed using any of the several methods that are disclosed above for forming the first capping layer 18 and the second capping layer 22. Typically the hard mask layer 24 comprises a silicon nitride hard mask material, or a silicon oxynitride hard mask material, that has a thickness from about 100 to about 1000 angstroms.

The resist layer 26 comprises a resist material that within the context of further processing of the semiconductor structure whose schematic cross-sectional diagram is illustrated in FIG. 1 is intended as a photoresist material. Such a photoresist material may be selected from the group including but not limited to positive photoresist materials, negative photoresist materials and hybrid photoresist materials that exhibit properties of both positive photoresist materials and negative photoresist materials. Typically and preferably, the resist layer 26 is located and formed upon the hard mask layer 24 within the semiconductor structure of FIG. 1 while using generally conventional methods, which will typically include spin-coating methods.

Figure 2:
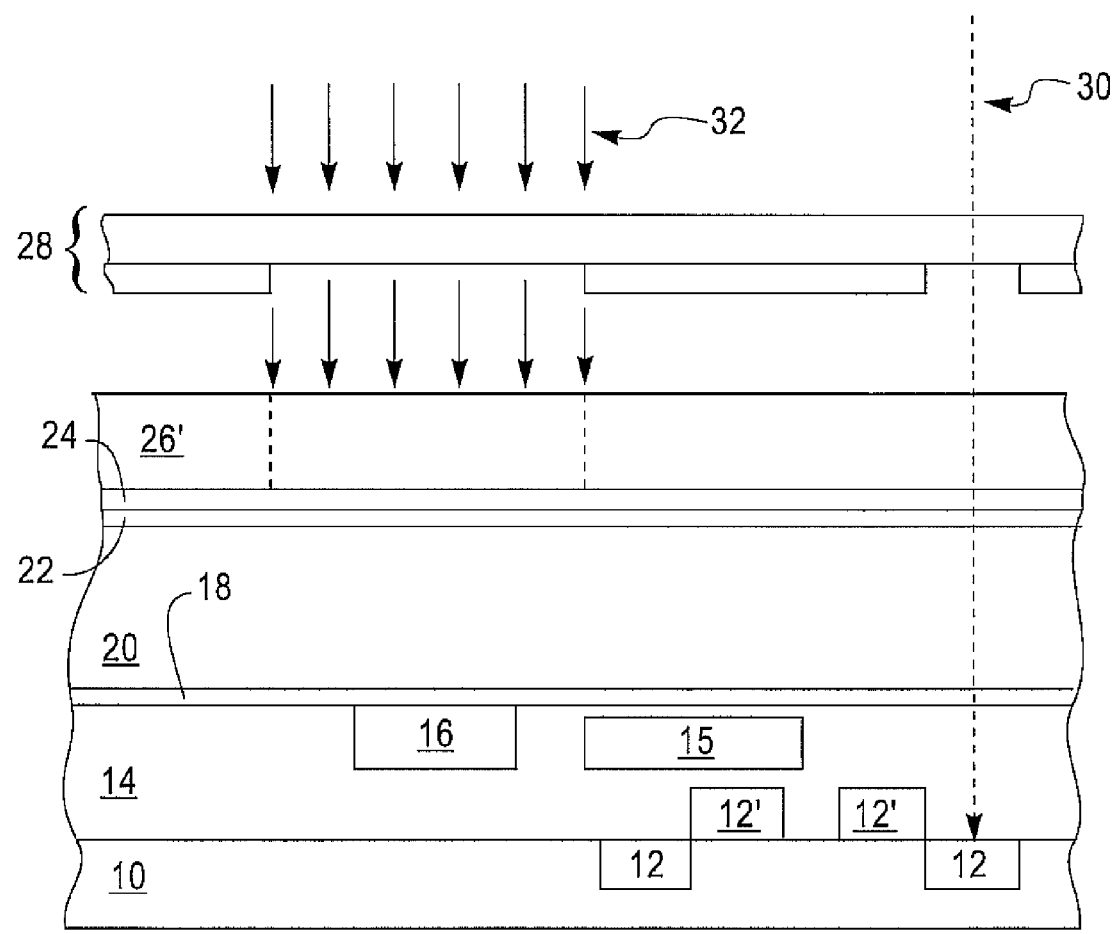

FIG. 2 shows the results of exposing (i.e., in particular photoexposing) the resist layer 26 that is illustrated within the schematic diagram of FIG. 1 with a optical exposure beam 32 that passes through a reticle 28 and is filtered by the reticle 28, to form a resist layer 26'. As is also illustrated within the schematic cross-sectional diagram of FIG. 2, the reticle 28 is aligned (i.e., registered) with respect to the semiconductor substrate 10 and the resist layer 26 by use of an alignment beam 30 with respect to one of the alignment marks 12 and 12', and in particular an alignment mark 12 that is not covered by the embedded conductor layer 15. Any of the alignment marks 12 or 12' is operative within the instant embodiment. When using an uncovered alignment mark 12 or 12', the alignment beam 30 may include, but is not limited to an electron beam and an optical beam. When using a covered alignment mark, 12 or 12' the alignment beam 30 may not be an optical beam.

Within the instant embodiment, the alignment beam 30 is typically an electron beam. Also, as disclosed above, since each of the alignment marks 12 and 12' at least comprises (and preferably consist essentially of) a comparatively high atomic number material while the buried conductor layer 15 and surrounding layers at least comprise (and preferably consist essentially of) a comparatively low atomic number material, the electron beam alignment beam 30 may readily penetrate through all intervening materials above the align marks 12 and 12', to provide a positive contrast of the alignment marks 12 and 12' with respect to the overlying layers from which are comprised the intervening materials.

Figure 3:
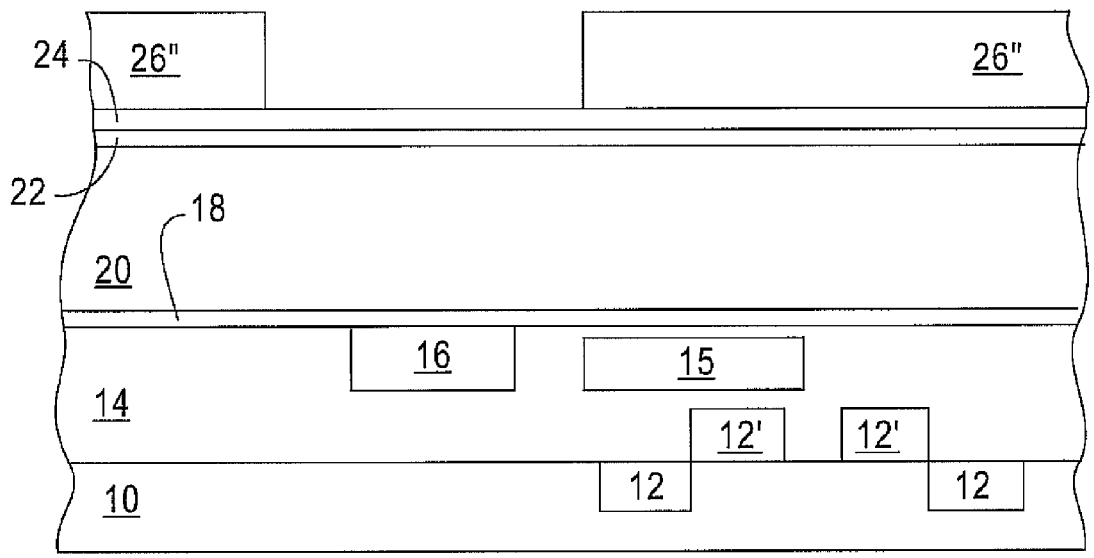

FIG. 3 shows the results of developing the resist layer 26' to form a resist layer 26". The resist layer 26' may be developed to form the resist layer 26" while using a developer that is otherwise generally conventional in the semiconductor fabrication art, and also appropriate to a resist material from which is comprised the resist layer 26'. While by no means limiting the instant embodiment or the invention, when the resist layer 26 as illustrated in FIG. 1 comprises a photo acid generated chemically amplified resist material, the resist layer 26' that is illustrated in FIG. 2 may be developed to form the resist layer 26" that is illustrated in FIG. 3 while using an alkaline developer solution, such as but not limited to an alkaline tetra-methyl-ammonium hydroxide solution.

Figure 4:
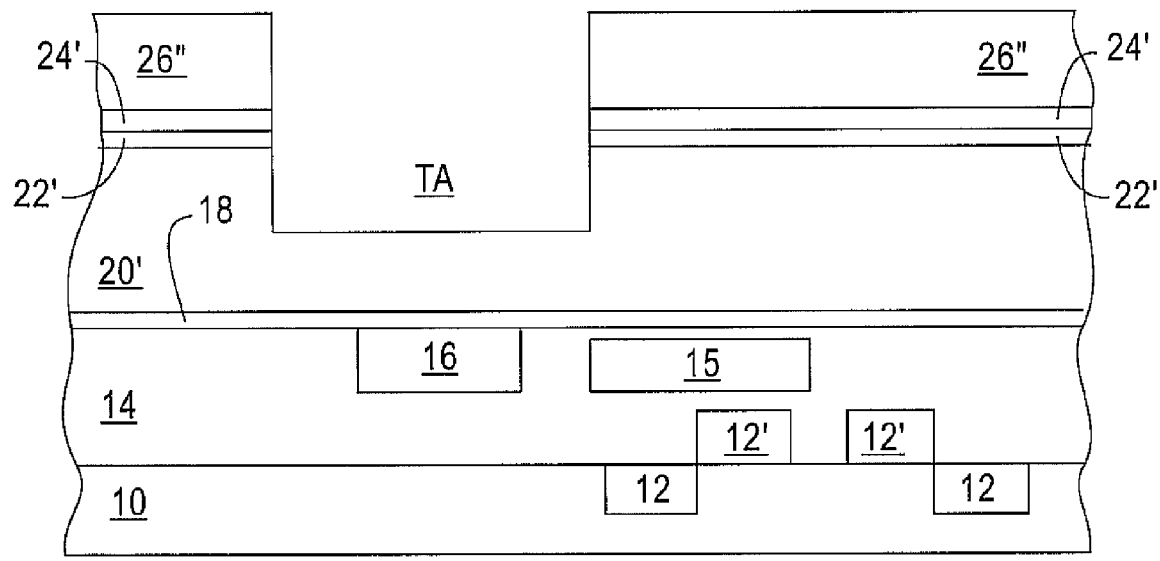

FIG. 4 shows the results of sequentially etching the hard mask layer 24, the second capping layer 22 and the second dielectric layer 20 to form a corresponding hard mask layer 24', second capping layer 22' and second dielectric layer 20', while using the resist layer 26" as an etch mask layer. The foregoing etching provides a trench aperture TA within the second dielectric layer 20'. The foregoing etching may be effected using etch methods and etch materials that are otherwise generally conventional in the semiconductor fabrication art. Although by no means limiting the embodiment, such etch methods and etch materials will typically include anisotropic plasma etch methods and anisotropic plasma etch materials that provide nominally straight sidewalls to the hard mask layer 24', the second capping layer 22' and the trench aperture TA within the second dielectric layer 20'. In general, when each of the hard mask layer 24, the second capping layer 22 and the second dielectric layer 20 at least in part comprises a silicon containing dielectric material, such as anisotropic plasma etch method may comprise a fluorine containing etchant gas composition as an anisotropic plasma etch material.

Figure 5:
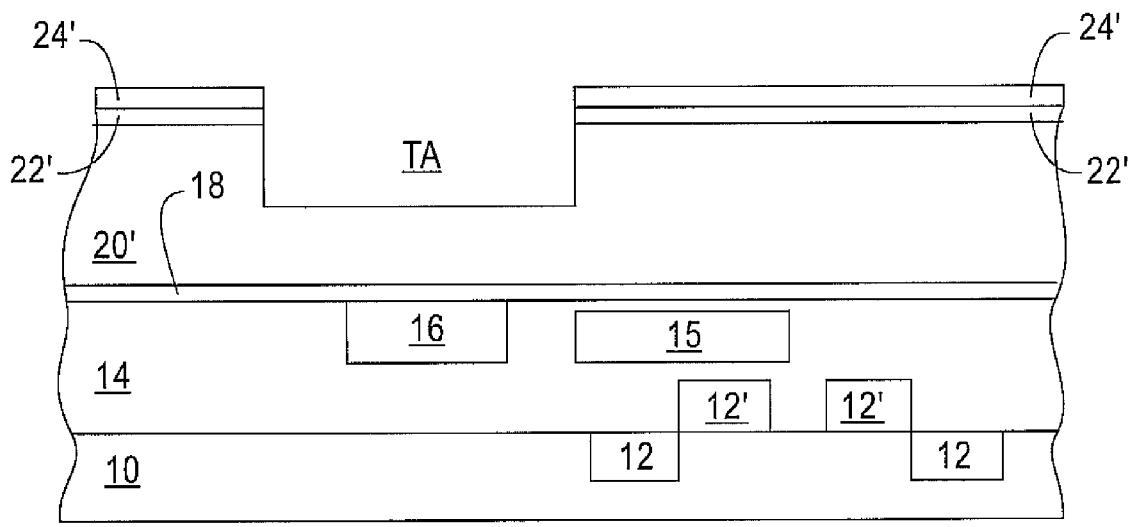

FIG. 5 shows the results of stripping the resist layer 26" from the semiconductor structure of FIG. 4 and in particular from the hard mask layer 24' within the semiconductor structure of FIG. 4. The resist layer 26" may be stripped using methods and materials that are otherwise generally conventional in the semiconductor fabrication art. Included are wet chemical stripping methods and materials, dry plasma stripping methods and materials and combinations of wet chemical stripping methods and materials and dry plasma stripping methods and materials.

Figure 6:
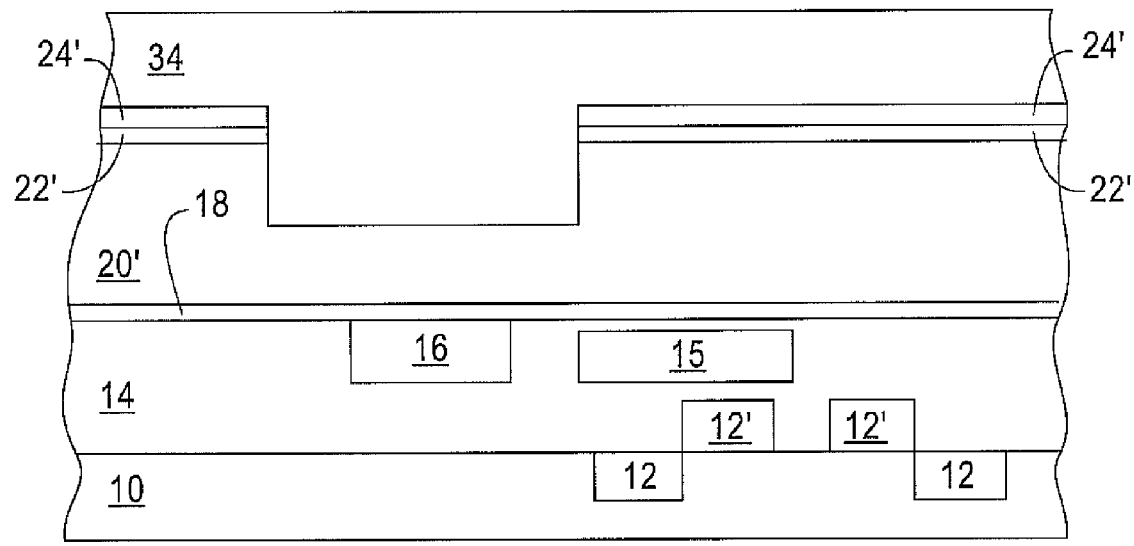

FIG. 6 shows a second resist layer 34 located upon the semiconductor structure of FIG. 5. The second resist layer 34 fills the trench aperture TA that is illustrated in FIG. 5 to provide a planarized second resist layer 34. The second resist layer 34 may in general comprise any of the several resist materials that are disclosed above within the context of the first resist layer 26. In that regard, the first resist layer 26 and the second resist layer 34 may comprise either the same material or different resist materials. For reasons as will become more apparent within the context of further disclosure below, the second resist layer 34 typically and preferably comprises a resist material that is susceptible to imaging with a direct write beam, and in particular a direct write electron beam. Desirably within the context of the instant embodiment, such a resist material that may be used for both the first resist layer 26 and the second resist layer 34 is a photo acid generated chemically amplified positive photoresist material. Other resist material compositions are not, however, precluded within the context of the embodiment or of the invention.

Figure 7:
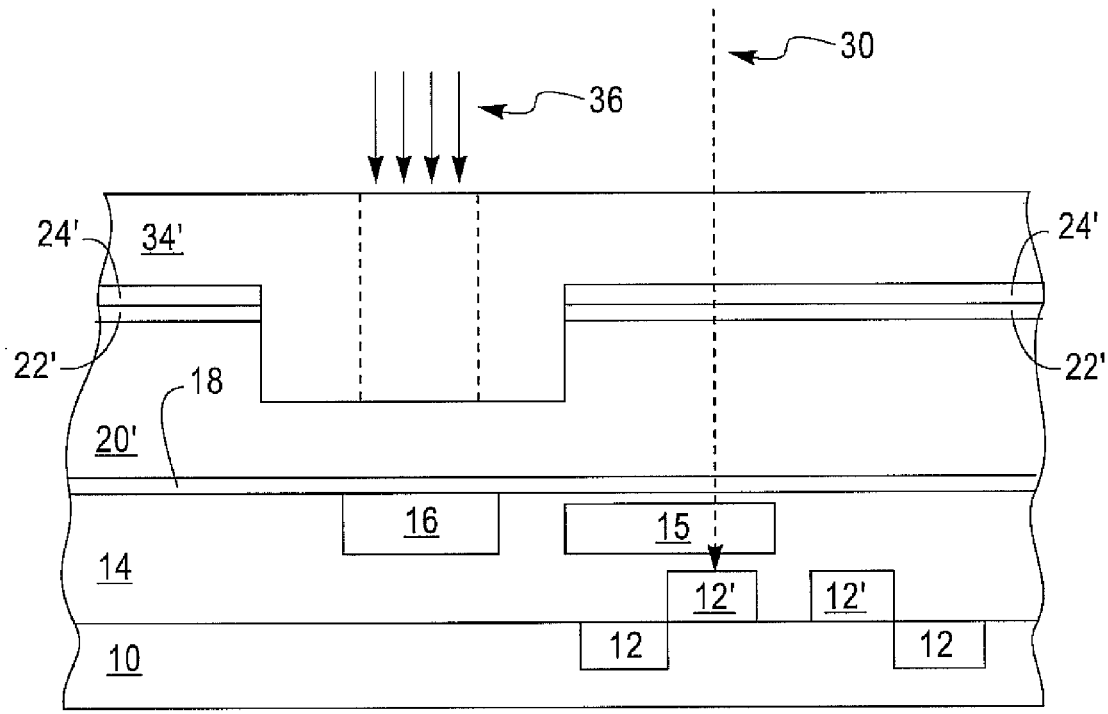

FIG. 7 shows the results of exposing the second resist layer 34 to form a second resist layer 34' while using a direct write beam 36 that typically comprises a direct write electron beam. Similarly with the semiconductor structure whose schematic cross-sectional diagram is illustrated in FIG. 4, the alignment beam 30, which is preferably an electron beam alignment beam, may align to either the alignment mark 12 or the alignment mark 12'. As is understood by a person skilled in the art, the use of a single alignment mark for aligning multiple structures within a single layer or within multiple layers within a semiconductor structure is desirable insofar as an overall alignment tolerance is reduced in comparison with using sequentially replicated alignment marks.

Figure 8:
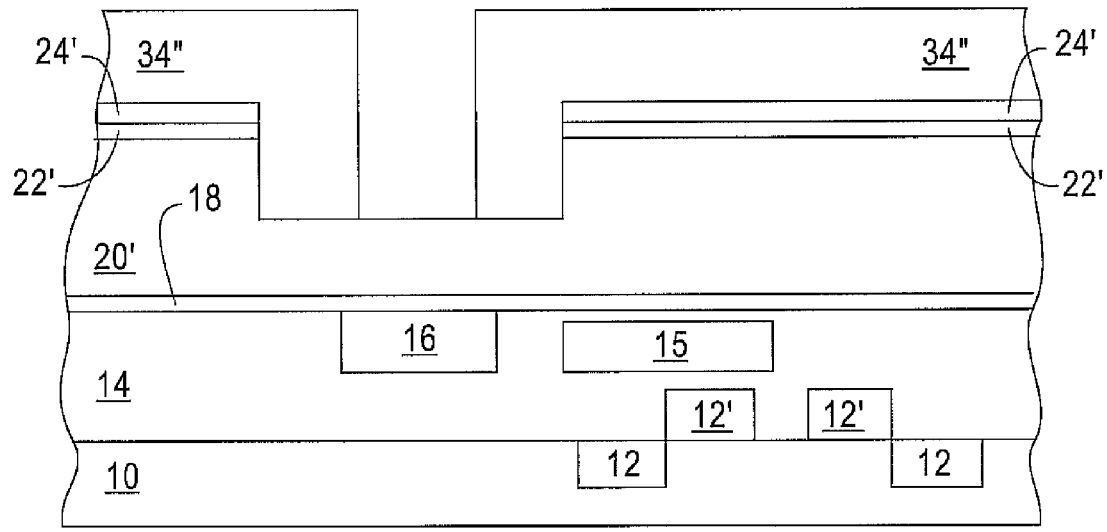

FIG. 8 shows the results of developing the second resist layer 34' that is illustrated in FIG. 7 to form a second resist layer 34". The second resist layer 34' that is illustrated in FIG. 7 may be developed to form the second resist layer 34" that is illustrated in FIG. 8 while using resist developer methods and materials analogous, equivalent or identical to the resist developer methods and materials that are used for developing the resist layer 26' that his illustrated in FIG. 2 to provide the resist layer 26" that is illustrated in FIG. 3.

Figure 9:
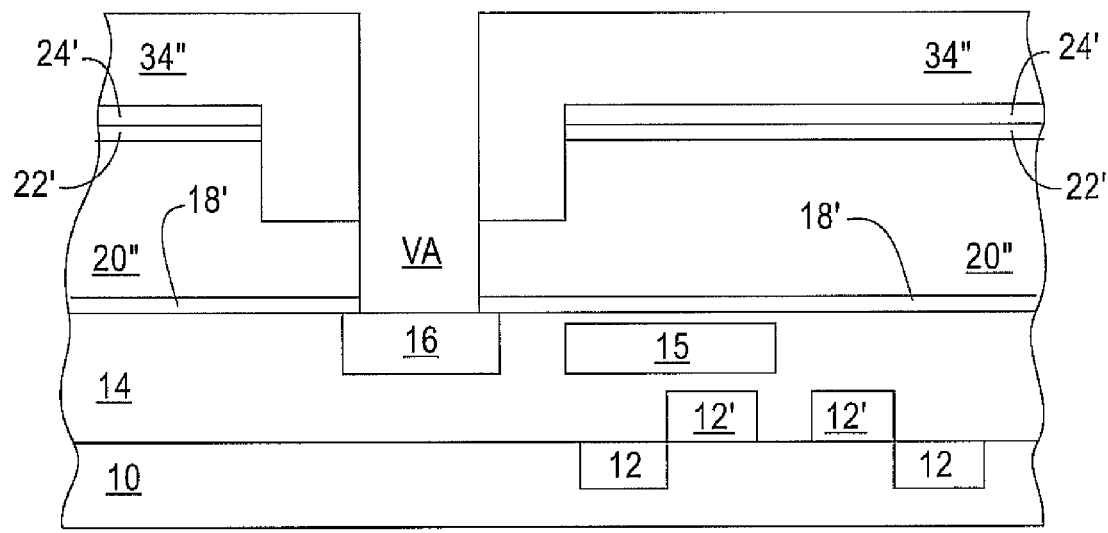

FIG. 9 shows the results of etching the second dielectric layer 20' and the first capping layer 18 that are illustrated in FIG. 8 to form a corresponding second dielectric layer 20" and a corresponding first capping layer 18', while using the second resist layer 34" as an etch mask layer The foregoing etching provides a via aperture VA within the second dielectric layer 20". The foregoing etching is generally analogous to the etching of the hard mask layer 24, the second capping layer 22 and the second dielectric layer 20 that is illustrated in FIG. 3 to provide the hard mask layer 24', the second capping layer 22' and the second dielectric layer 20' that is illustrated in FIG. 4. Analogous, equivalent or identical anisotropic plasma etch methods and materials may be used.

Figure 10:
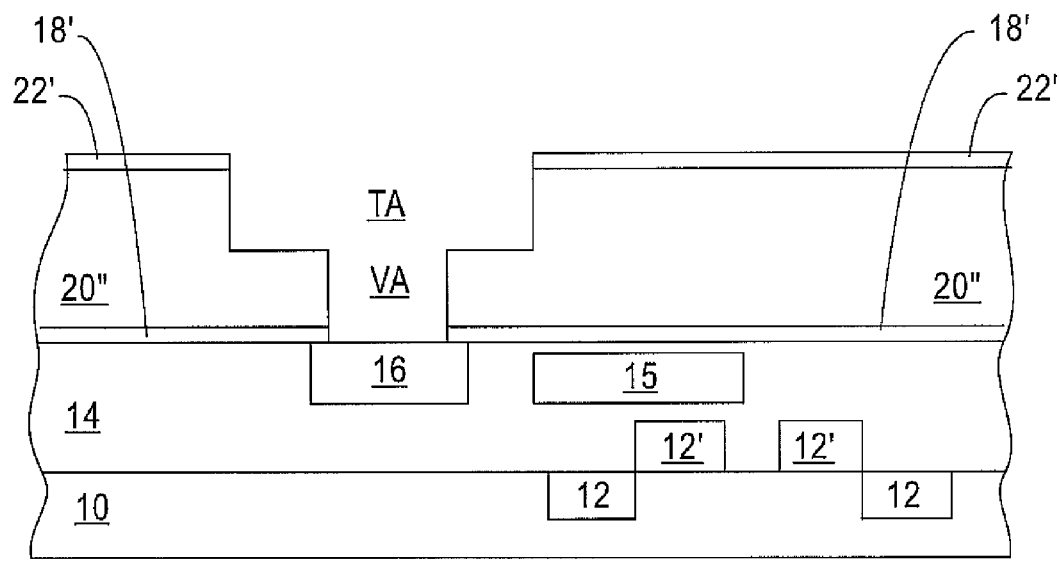

FIG. 10 shows the results of sequentially stripping the second resist layer 34" and the hard mask 24' from the semiconductor structure of FIG. 9. The second resist layer 34" and the hard mask layer 24' may be stripped using methods and materials that are otherwise generally conventional in the semiconductor fabrication art. Stripping of the second resist layer 34" may be effected using stripping methods and materials analogous, equivalent or identical to the stripping methods and materials used for stripping the first resist layer 26" from the semiconductor structure of FIG. 4 to provide the semiconductor structure of FIG. 5. Stripping of the hard mask layer 24' may be effected using methods and materials appropriate to the materials of composition of the hard mask layer 24'. As is illustrated within the schematic cross-sectional diagram of FIG. 10, the foregoing stripping of the second resist layer 34" provides a via aperture VA within the second dielectric layer 20" that is contiguous with the trench aperture TA within the second dielectric layer 20" to thus provide a dual damascene aperture within the second dielectric layer 20".

FIG. 1 shows the results of forming a contiguous via and interconnect layer 38 into the corresponding via aperture VA that is contiguous with the trench aperture TA (i.e., the dual damascene aperture) that is illustrated in FIG. 10, to provide a completed dual damascene structure within a semiconductor structure. The contiguous via and interconnect layer 38 layer is typically formed using a blanket layer deposition method that provides particular conductor liner layers lining the dual damascene aperture, and a particular conductor material located upon the liner layers and filling the dual damascene aperture. Portions of the liner layers and core conductor layer overlying the liner layers within the dual damascene aperture may then be planarized to the level of the second capping layer 22' while using a planarizing method. Candidate planarizing methods include, but are not limited to mechanical planarizing methods and chemical mechanical polish planarizing methods. Chemical mechanical polish planarizing methods are particularly common. Candidate conductor liner layer materials may comprise conductor materials including but not limited to titanium, tantalum and tungsten conductor materials, as well as nitrides of those conductor materials. Candidate core conductor materials for the contiguous via and interconnect layer 38 include copper and copper alloy core conductor materials, although the embodiment and the invention are not necessarily so limited.

Figure 11:
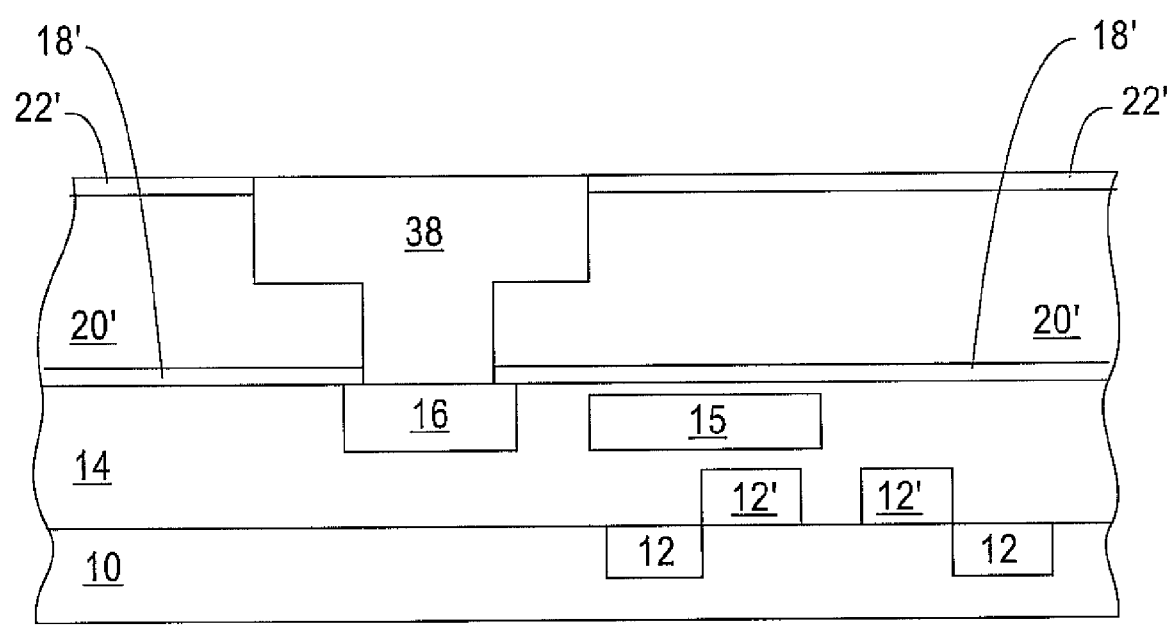

FIG. 11 shows a schematic cross-sectional diagram of a semiconductor structure in accordance with a particular embodiment of the invention. The semiconductor structure includes a semiconductor substrate 10 within, upon or (although not necessarily specifically illustrated) over which is located at least one alignment mark 12 or 12', for example. The semiconductor structure also includes a contiguous via and interconnect layer 38 that is located within a dual damascene aperture that includes a via aperture VA that is contiguous with a trench aperture TA. Within the embodiment, the alignment mark 12 or 12' comprises, and preferably consists essentially of, at least one substantially present element having an atomic number at least 5 greater than a highest atomic number substantially present element within materials that surround the alignment mark (i.e., including the substrate), and preferably at least 10 greater, and more preferably at least 20 greater than the highest atomic number substantially present element within the materials that surround the alignment mark. The alignment mark 12 or 12' typically comprises at least one material that has an atomic number greater than about 19, and preferably from about 19 to about 109. By using within the embodiment, and the invention, an alignment mark that comprises or consists essentially of such a generally high atomic number material, a direct write beam or a reticle may be readily aligned and registered with respect to a resist layer located over the semiconductor substrate 10 when using an electron beam as an alignment beam. Such a comparatively high atomic number material for the alignment mark 12 or 12' provides a positive electron beam alignment beam contrast with respect to surrounding layers, including conductor layers, through which the alignment beam passes.

The preferred embodiment illustrates the invention within the context of a trench first dual damascene aperture formation method that uses optical lithography for forming a trench aperture TA and direct write lithography for forming a via aperture VA contiguous with the trench aperture TA. This particular lithographic sequencing and lithographic methodology provides advantage insofar as a larger dimensioned trench aperture TA may be formed using a more efficient optical lithography method while a smaller dimensioned via aperture VA may be fabricated using a less efficient direct write method. However, neither the embodiment nor the invention is so limited. Rather, the embodiment and the invention contemplate that: (1) an optical lithography method may be used for forming both a trench aperture and a via aperture within a dual damascene aperture; (2) a direct write lithographic method may be used for forming both a trench aperture and a via aperture within a dual damascene aperture; or (3) one of the via aperture and the via aperture within the dual damascene aperture may be formed using a direct write lithography method while the other of the via aperture and the trench aperture within the dual damascene aperture may be formed using an optical lithography method.

As is understood by a person skilled in the art, the instant embodiment uses two separate resist layers that may comprise the same photoresist material. However, the embodiment and the invention are also not limited to circumstances where multiple resist layers are used. Other plausible embodiments may use a single resist layer and a single resist composition that may include a multilayer resist composition, while still benefiting from enhanced alignment capabilities of the method of the invention.

The preferred embodiment is illustrative of the invention rather than limiting of the invention. Revisions and modifications may be made to methods, materials, structures and dimensions of a semiconductor structure fabricated in accordance with the preferred embodiment of the invention, while still providing a microelectronic structure and a method for fabrication thereof in accordance with the invention, further in accordance with the accompanying claims.

What is claimed is:

1. A microelectronic structure comprising:
   a dielectric layer located over a substrate and including a dual damascene aperture within the dielectric layer;
   a first alignment mark located over the substrate, the first alignment mark comprising at least one substantially present element having an atomic number at least 5 greater than a highest atomic number substantially present element within materials surrounding the first alignment mark over the first portion of the substrate; and
   a second alignment mark located over the substrate, wherein the second alignment mark is present underlying a buried conductor layer, and the first alignment mark is not present under the buried conductor layer, wherein the second alignment mark is not present directly under a material layer of the first alignment mark.

2. The microelectronic structure of claim 1 wherein the substrate comprises a bulk semiconductor substrate.

3. The microelectronic structure of claim 1 wherein the substrate comprises a semiconductor-on-insulator substrate.

4. The microelectronic structure of claim 1 wherein the substrate includes microelectronic devices.

5. The microelectronic structure of claim 1 wherein:
   the substrate comprises a semiconductor substrate; and
   the at least one alignment mark is embedded within the semiconductor substrate.

6. The microelectronic structure of claim 1 wherein;
   the substrate comprises a semiconductor substrate; and
   the first alignment mark and the second alignment mark are not embedded within the semiconductor substrate.

7. The microelectronic structure of claim 1 wherein the first alignment mark consists essentially of the at least one material having the atomic number of greater than about 19.

8. The microelectronic structure of claim 1 wherein the first alignment mark comprises at least one material having an atomic number from about 19 to about 109.

9. A method for fabricating a microelectronic structure comprising:
   providing a structure that includes a dielectric layer located over a substrate, and at least two alignment marks located interposed between the dielectric layer and the substrate, the at least two alignment marks comprising at least one substantially present element having an atomic number at least 5 greater than a highest atomic number substantially present element within materials surrounding the at least two alignment marks;
   forming one of a trench aperture and a via aperture within the dielectric layer while using a first alignment mark of the at least two alignment marks for lithographically aligning the substrate;
   forming the other one of the trench aperture and the via aperture within the dielectric layer while using a second alignment mark of the at least two alignment marks for lithographically aligning the substrate, to form a dual damascene aperture within the dielectric layer, wherein the second alignment mark is not present directly under a material layer of the first alignment mark.

10. The method of claim 9 wherein the trench aperture is formed first.

11. The method of claim 9 wherein the via aperture is formed first.

12. The method of claim 9 further comprising forming a contiguous via and interconnect layer into the dual damascene aperture.

13. The method of claim 9 wherein the forming the one of the trench aperture and the via aperture and the forming the other of the trench aperture and the via aperture uses a single resist layer.

14. The method of claim 9 wherein the forming the one of the trench aperture and the via aperture and the forming the other of the trench aperture and the via aperture uses separate resist layers.

15. The method of claim 9 wherein the lithographically aligning the substrate is undertaken using an electron beam alignment beam.

16. The method of claim 15 wherein the electron beam alignment beam also passes through a conductor layer interposed between the alignment mark and the dielectric layer.

17. A method for fabricating a microelectronic structure comprising:

providing a structure that includes a dielectric layer located over a substrate, and at least two alignment marks located interposed between the dielectric layer and the substrate, the at least two alignment marks comprising at least one substantially present element having an atomic number at least 5 greater than a highest atomic number substantially present element within materials surrounding the at least two alignment marks;

forming a trench aperture within the dielectric layer while using an optical lithographic method that uses a first alignment mark of the at least two alignment marks for lithographically aligning the substrate;

forming a via aperture within the dielectric layer and contiguous with the trench aperture while using a direct write lithography method that uses a second alignment mark of the at least two alignment marks for lithographically aligning the substrate, to thus form a dual damascene aperture within the dielectric layer, wherein the second alignment mark is not present directly under a material layer of the first alignment mark.

18. The method of claim 17 wherein forming the trench uses a first resist layer and the forming the via uses a second resist layer different than the first resist layer.

19. The method of claim 17 wherein both the forming the trench and the forming the via use an electron beam alignment beam for lithographically aligning the substrate.

20. The method of claim 19 wherein the electron beam alignment beam passes through a conductor layer comprising a material having an atomic number less than about 35 when lithographically aligning the substrate.

* * * * *